US009472305B2

(12) United States Patent
Choo et al.

(10) Patent No.: US 9,472,305 B2
(45) Date of Patent: Oct. 18, 2016

(54) METHOD OF REPAIRING A MEMORY DEVICE AND METHOD OF BOOTING A SYSTEM INCLUDING THE MEMORY DEVICE

(71) Applicant: Samsung Electronics Co., Ltd., Suwon-Si, Gyeonggi-Do (KR)

(72) Inventors: Min-Yeab Choo, Suwon-si (KR); Bu-Il Jung, Hwaseong-si (KR); Do-Geun Kim, Seoul (KR); Mi-Kyoung Park, Seoul (KR); Dong-Yang Lee, Yongin-si (KR); Sun-Young Lim, Hwaseong-si (KR); Ju-Yun Jung, Hwaseong-si (KR); Hyuk Han, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 14 days.

(21) Appl. No.: 14/534,492

(22) Filed: Nov. 6, 2014

(65) Prior Publication Data
US 2015/0131393 A1   May 14, 2015

(30) Foreign Application Priority Data

Nov. 14, 2013 (KR) .......................... 10-2013-0138555

(51) Int. Cl.
*G11C 29/04* (2006.01)
*G11C 29/00* (2006.01)

(52) U.S. Cl.
CPC .............. *G11C 29/04* (2013.01); *G11C 29/78* (2013.01); *G11C 29/785* (2013.01); *G11C 29/88* (2013.01)

(58) Field of Classification Search
CPC .............................. G11C 29/785; G11C 29/88

USPC ......................................................... 365/200
See application file for complete search history.

(56) References Cited

U.S. PATENT DOCUMENTS

| 5,848,009 A | 12/1998 | Lee et al. | |
| 6,262,926 B1* | 7/2001 | Nakai | G11C 16/08 365/200 |
| 6,678,195 B2 | 1/2004 | Hidaka | |
| 6,813,735 B1* | 11/2004 | Kurihara | G11C 29/846 714/711 |
| 8,255,742 B2 | 8/2012 | Ipek et al. | |

(Continued)

FOREIGN PATENT DOCUMENTS

| JP | 11110996 A | 4/1999 |
| JP | 2005-149667 A | 6/2005 |

(Continued)

*Primary Examiner* — Hoai V Ho
*Assistant Examiner* — Jay Radke
(74) *Attorney, Agent, or Firm* — Harness, Dickey & Pierce, P.L.C.

(57) ABSTRACT

A method of repairing a memory device including a boot memory region, a normal memory region, and a redundant memory region, the redundant memory region including a plurality of repair memory units, includes repairing the boot memory region by performing at least one of excluding first fault memory units of the boot memory region from use as storage and replacing the first fault memory units with boot repair memory units of the repair memory units, each of the first fault memory units having at least one fault memory cell; and after the repairing the boot memory region, repairing the normal memory region by performing at least one of excluding second fault memory units from use as storage and replacing the second fault memory units with normal repair memory units of the repair memory units.

19 Claims, 15 Drawing Sheets

(56) References Cited

U.S. PATENT DOCUMENTS 8,446,787 B2 5/2013 Sarin et al.
2003/0043626 A1* 3/2003 Abe .................... G11C 29/808
365/185.09

FOREIGN PATENT DOCUMENTS

| JP | 3908418 B2 | 4/2007 |
| KR | 0586068 B1 | 5/2006 |

* cited by examiner

METHOD OF REPAIRING A MEMORY DEVICE AND METHOD OF BOOTING A SYSTEM INCLUDING THE MEMORY DEVICE

CROSS-REFERENCE TO RELATED APPLICATION

This U.S. Non-provisional application claims priority under 35 USC §119 to Korean Patent Application No. 10-2013-0138555, filed on Nov. 14, 2013, in the Korean Intellectual Property Office (KIPO), the disclosure of which is incorporated by reference in its entirety herein.

BACKGROUND

1. Technical Field

Example embodiments relate generally to a memory device, and more particularly to a method of repairing a memory device and a method of booting a system including the memory device.

2. Discussion of the Related Art

As integration degree of a memory device increases, the number of fault memory cells included in the memory device increases significantly. The memory device including the fault memory cells may be repaired by replacing the fault memory cells with redundant memory cells. When the number of the fault memory cells is larger than the number of the redundant memory cells, all fault memory cells cannot be replaced with the redundant memory cells.

SUMMARY

At least one example embodiment of the inventive concepts provides a method of repairing a memory device when all fault memory cells included in the memory device cannot be replaced with redundant memory cells.

According to at least one example embodiment of the inventive concepts, a method of repairing a memory device including a boot memory region, a normal memory region, and a redundant memory region, the redundant memory region including a plurality of repair memory units includes repairing the boot memory region by performing at least one of excluding first fault memory units of the boot memory region from use as storage and replacing the first fault memory units with boot repair memory units of the repair memory units, each of the first fault memory units having at least one fault memory cell; and after the repairing the boot memory region is completed, repairing the normal memory region by performing at least one of excluding second fault memory units of the normal memory region from use as storage and replacing the second fault memory units with normal repair memory units of the repair memory units, each of the second fault memory units having at least one fault memory cell.

At least one of the first fault memory units and the second fault memory units may correspond, respectively, to word lines of the memory device such that at least one of the repairing the boot memory region and the repairing the normal memory region includes repairing memory units of a word line of the memory device.

At least one of the first fault memory units and the second fault memory units may correspond, respectively, to bit lines of the memory device such that at least one of the repairing the boot memory region and the repairing the normal memory region includes repairing memory units of a bit line of the memory device.

The memory device may include at least one first memory bank corresponding to the boot memory region, at least one second memory bank corresponding to the normal memory region, and at least one first redundant memory block and at least one second redundant memory block corresponding to the redundant memory region, the first redundant memory block being allocated to the first memory bank, and the second redundant memory block being allocated to the second memory bank, such that the repairing the boot memory region includes repairing units of the at least one first memory bank, and the repairing the normal memory region includes repairing units of the at least one second memory bank.

The repairing the boot memory region may include using only first repair memory units included in the first redundant memory block as the boot repair memory units, and the repairing the normal memory region may include using only second repair memory units included in the second redundant memory block as the normal repair memory units.

A size of the first redundant memory block may be larger than a size of the second redundant memory block.

The repairing the boot memory region may include using first repair memory units included in the first redundant memory block and second repair memory units included in the second redundant memory block as the boot repair memory units, and the repairing the normal memory region may include using third repair memory units included in the second redundant memory block as the normal repair memory units.

The memory device may include at least one first memory bank corresponding to the boot memory region, at least one second memory bank corresponding to the normal memory region, and a redundant memory block corresponding to the redundant memory region, and the redundant memory block may be allocated only to the first memory bank, such that the repairing the boot memory region includes repairing units of the at least one first memory bank, and the repairing the normal memory region includes repairing units of the at least one second memory bank.

The repairing the boot memory region may include replacing the first fault memory units with the boot repair memory units included in the redundant memory block, and the repairing the normal memory region may include excluding the second fault memory units from use as storage.

The repairing the boot memory region may include changing an address map for the memory device to exclude the first fault memory units, and a memory controller may include the address map.

The repairing the boot memory region may include changing an address map for the memory device to exclude the second fault memory units, and a memory controller may include the address map.

The method may further include loading a boot loader and an execution code of an operating system to the boot memory region.

A sum of the number of the first fault memory units and the number of the second fault memory units may be larger than the number of the repair memory units of the redundant memory region.

According to at least one example embodiment of the inventive concepts, a method of booting a system including a memory device including a boot memory region, a normal memory region, and a redundant memory region, the redundant memory region including a plurality of repair memory units, may include repairing the boot memory region by performing at least one of excluding first fault memory units of the boot memory region from use as storage and replacing the first fault memory units with boot repair memory units of the repair memory units, each of the first fault memory units having at least one fault memory cell; after the repairing the boot memory region is completed, repairing the normal memory region by performing at least one of excluding second fault memory units of the normal memory region from use as storage and replacing the second fault memory units with normal repair memory units of the repair memory units, each of the second fault memory units having at least one fault memory cell; loading a boot loader and an execution code of an operating system to the boot memory region; and executing the boot loader and the execution code of the operating system.

The method may further include controlling the operating system such that the operating system does not use unrepaired fault memory units included in the second fault memory units.

According to at least one example embodiment of the inventive concepts, a method of operating a memory system may include identifying a first fault memory cell in a first memory unit of a boot memory region of the memory system; identifying a second fault memory cell in a second memory unit of a normal memory region of the memory system; repairing the boot memory region by replacing the first memory unit with a first redundant unit from a first redundant memory region of the memory system; repairing the normal memory region by replacing the second memory unit with a second redundant unit from a second redundant memory region of the memory system, the second redundant memory region including fewer redundant units than the first redundant memory region; and storing code for at least one of a boot loader, a basic input/output system (BIOS) and an operating system in the repaired boot memory region.

The method may further include storing application code other than the code for the boot loader, the basic input/output system (BIOS) and the operating system in the repaired normal memory region.

When the normal memory region includes a third fault memory cell in a third memory unit, the method may further include repairing the normal memory region by excluding the third memory unit from use as storage without replacing the third memory unit with a redundant memory unit.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
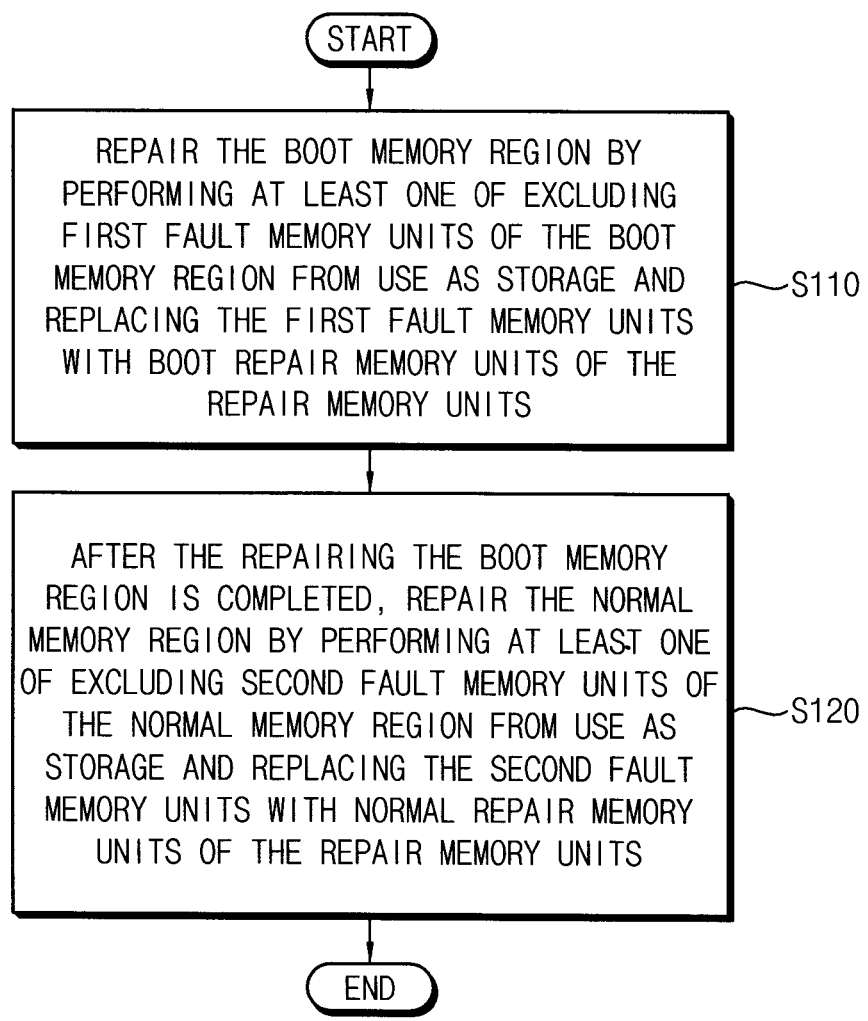
FIG. 1 is a flow chart illustrating a method of repairing a memory device according to at least one example embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, third etc. may be used herein to describe various elements, these elements should not be limited by these terms. These terms are used to distinguish one element from another. Thus, a first element discussed below could be termed a second element without departing from the teachings of at least one example embodiment of the inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of at least one example embodiment of the inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
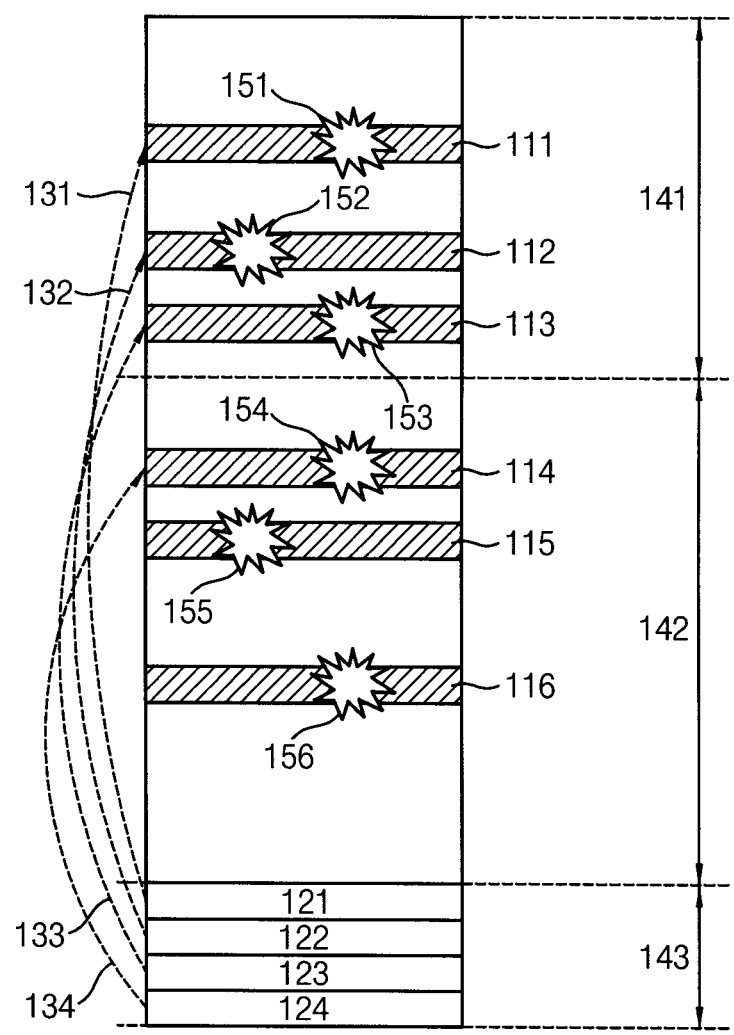
FIG. 2 is a diagram for describing an example of repairing a memory device including fault memory cells according to the method of FIG. 1.

FIG. 1 is a flow chart illustrating a method of repairing a memory device according to at least one example embodiment of the inventive concepts and FIG. 2 is a diagram describing an example of repairing a memory device including fault memory cells according to the method of FIG. 1. A fault memory cell may be, for example, a faulty or inoperable cell including, for example, a cell that produces a plurality of read and/or write errors. A fault memory unit is, for example, a group of cells that include at least one fault memory cell.

Referring to FIGS. 1 and 2, a memory device 100 includes a boot memory region 141, a normal memory region 142, and a redundant memory region 143. The redundant memory region 143 includes a plurality of repair memory units 121, 122, 123, and 124.

The boot memory region 141 may be repaired (S110) by excluding first fault memory units 111, 112, and 113 of the boot memory region 141 or replacing 131, 132, and 133 the first fault memory units 111, 112, and 113 with boot repair memory units 121, 122 and 123 of the repair memory units 121, 122, 123, and 124. Each of the first fault memory units has at least one fault memory cell 151, 152, and 153.

After repairing the boot memory region 141 is completed, the normal memory region 142 may be repaired (S120) by excluding second fault memory units 114, 115, and 116 of the normal memory region 142 or replacing 134 at least one of the second fault memory units 114, 115, and 116 with the normal repair memory unit 124 of in the repair memory units 121, 122, 123, and 124. Each of the second fault memory units 114, 115, and 116 has at least one fault memory cell 154, 155, and 156.

A sum of the number of the first fault memory units 111, 112, and 113 and the number of the second fault memory units 114, 115, and 116 may be larger than the number of the repair memory units 121, 122, 123, and 124 of the redundant memory region 143. The errors may happen when data is written to or read from the fault memory cells 155 and 156 included in the second fault memory units 115 and 116 which are not replaced with repair memory units. The second fault memory units 115 and 116 may be excluded from use.

The structure excluding the first fault memory units 111, 112, and 113 or the second fault memory units 114, 115, and 116 will be described with reference to FIG. 12. The hardware structure of the memory device replacing 131, 132, 133, and 134 the first fault memory units 111, 112, and 113 and the second fault memory units 114, 115, and 116 with the repair memory units 121, 122, 123, and 124 of the redundant memory region 143 will be described with the references to FIGS. 4 through 11.

The first fault memory unit 111 may further include a plurality of fault memory cells besides the first fault memory cell 151. The fault memory cells included in the first fault memory unit 111 may be neighbored each other or may be separated from each other. Each of the first fault memory units 112, 113 and each of the second fault memory units 114, 115, and 116 have the same or similar structures with the first fault memory unit 111.

Each of the first fault memory units 111, 112, and 113 or each of the second fault memory units 114, 115, and 116 may correspond to a word line of the memory device 100. Each of the first fault memory units 111, 112, and 113 or each of the second fault memory units 114, 115, and 116 may be a set of memory cells included in a word line of the memory device 100.

Each of the first fault memory units 111, 112, and 113 or each of the second fault memory units 114, 115, and 116 may correspond to a bit line of the memory device 100. Each of the first fault memory units 111, 112, and 113 or each of the second fault memory units 114, 115, and 116 may be a set of memory cells included in a bit line of the memory device 100.

Figure 3:
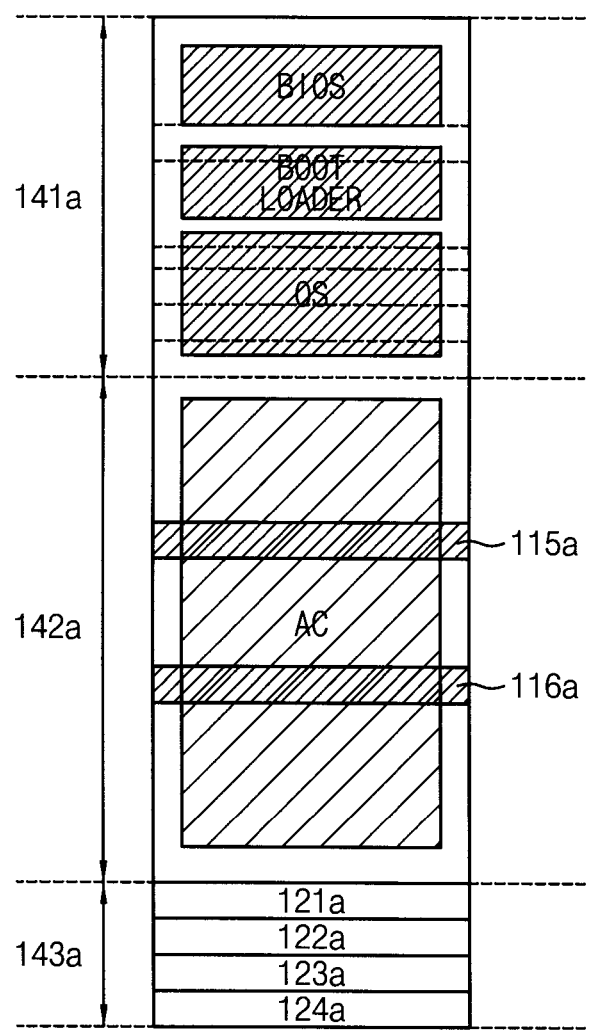
FIG. 3 is a diagram illustrating a memory device which is repaired according to the method of FIG. 1.

FIG. 3 is a diagram illustrating a memory device which is repaired according to the method of FIG. 1.

Referring to FIG. 3, a repaired memory device 100a may include a repaired boot memory region 141 that is repaired by boot repair memory units 121a, 122a, and 123a, a partially repaired normal memory region 142a that is repaired by a normal repair memory unit 124a, and a redundant memory region 143a. The redundant memory region 143a includes the boot repair memory units 121a, 122a, and 123a and the normal repair memory unit 124a.

As is illustrated in FIG. 3, according to at least one example embodiment, the boot memory region 141a may be defined as a region for storing system data including, for example, a basis input/output system (BIOS), a boot loader and an execution code of an operating system (OS); the redundant memory region 143a may be defined as a region composed of repair units; and the normal memory region 141a may be defined as a region for storing application data and/or user data other than system data. For example, according to at least one example embodiment, the normal memory region 142a may be defined as a region that is not used to store system data and does not include repair units.

The BIOS, boot loader and execution code of the OS may be loaded to the repaired boot memory region 141a. After controlling the operating system not to use unrepaired second memory units 115a, 116a, an application code may be loaded to the partially repaired normal memory region 142a.

Figure 4:
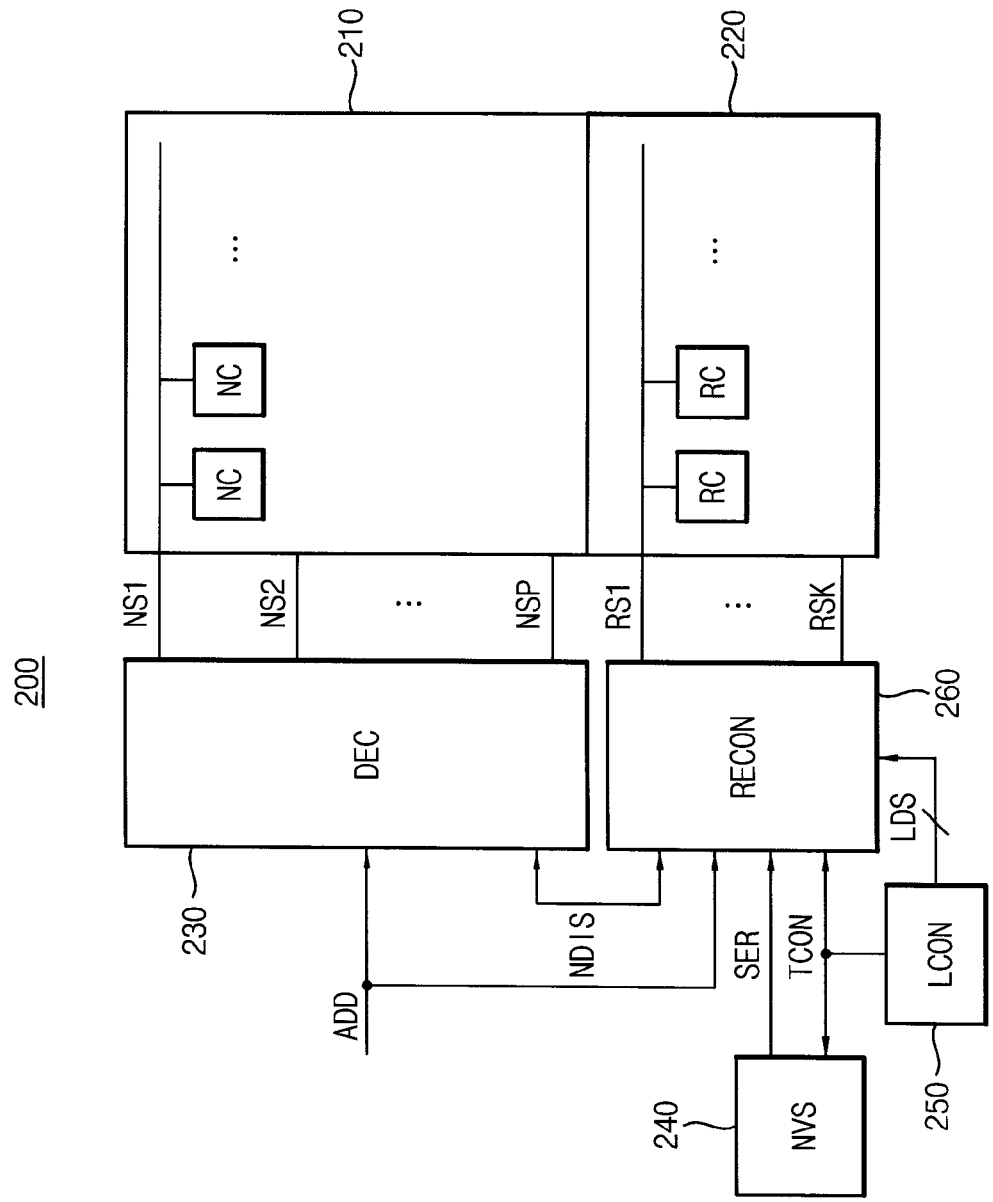
FIG. 4 is a block diagram illustrating an example memory device having a repair function.

FIG. 4 is a block diagram illustrating an example memory device having repair function.

Referring to FIG. 4, a memory device 200 may include a memory cell array 210, 220, a decoder DEC 230, a non-volatile storage NVS 240, a load controller LCON 250, and a repair control circuit RECON 260.

The memory cell array 210, 220 may include a normal memory cell array 210 and a redundant memory cell array 220. The normal memory cell array 210 corresponds to the boot memory region 141 and the normal memory region 142 included in the memory device 100 of FIG. 2. The redundant memory cell array 220 corresponds to the redundant memory region 143 included in the memory device 100 of FIG. 2. The normal memory cell array 210 includes normal memory cells NC connected to normal selection lines NS1 through NSP. The redundant memory cell array 220 includes redundant memory cells RC connected to redundant selection lines RS1 through RSK. The values 'P' and 'K' may each be positive integers greater than 1.

The decoder 230 selects one of the normal selection lines NS1 through NSP based on address ADD for a read operation or a write operation. The read operation or write operation may be executed to the normal memory cells NC connected to selected normal selection line.

The non-volatile storage 240 stores a fail address FADD describing a location of a fault memory cell included in the normal memory cells NC. The non-volatile storage 240 outputs a serial signal SER based on the stored fail address FADD when power is turned-on. The fail address FADD may be stored to the non-volatile storage 240 through test sequences of the memory device 200. The load controller LCON 250 generates a plurality of loading selection signals LDS which are enabled sequentially in every unit period. The LCON 250 may also generate a timing control signal TCON.

The repair control circuit 260 stores the fail address FADD based on the serial signal SER and the loading selection signals LDS. The repair control circuit 260 executes an operation replacing an access of the normal memory cells NC to an access of the redundant memory cells RC when address ADD is the same as the stored fail address FADD. In short, the repair control circuit 260 selects one of redundant selection lines RS1 through RSK and disables the decoder 230 based on a disable signal NDIS when address ADD is the same as the stored fail address FADD.

According to at least one example embodiment of the inventive concepts, the normal selection lines NS1 through NSP and the redundant selection lines RS1 through RSK may represent word lines. In this case, the repair control circuit 260 may execute replacing operation in the unit of word line. When a plurality of pages are included in a word line, the repair control circuit 260 may execute replacing operation in the unit of page.

According to at least one example embodiment of the inventive concepts, the normal selection lines NS1 through NSP and the redundant selection lines RS1 through RSK may represent bit lines. In this case, the repair control circuit 260 may execute replacing operation in the unit of bit line.

FIGS. 5 through 11 are block diagrams illustrating memory devices according to at least one example embodiment of the inventive concepts.

Figure 5:
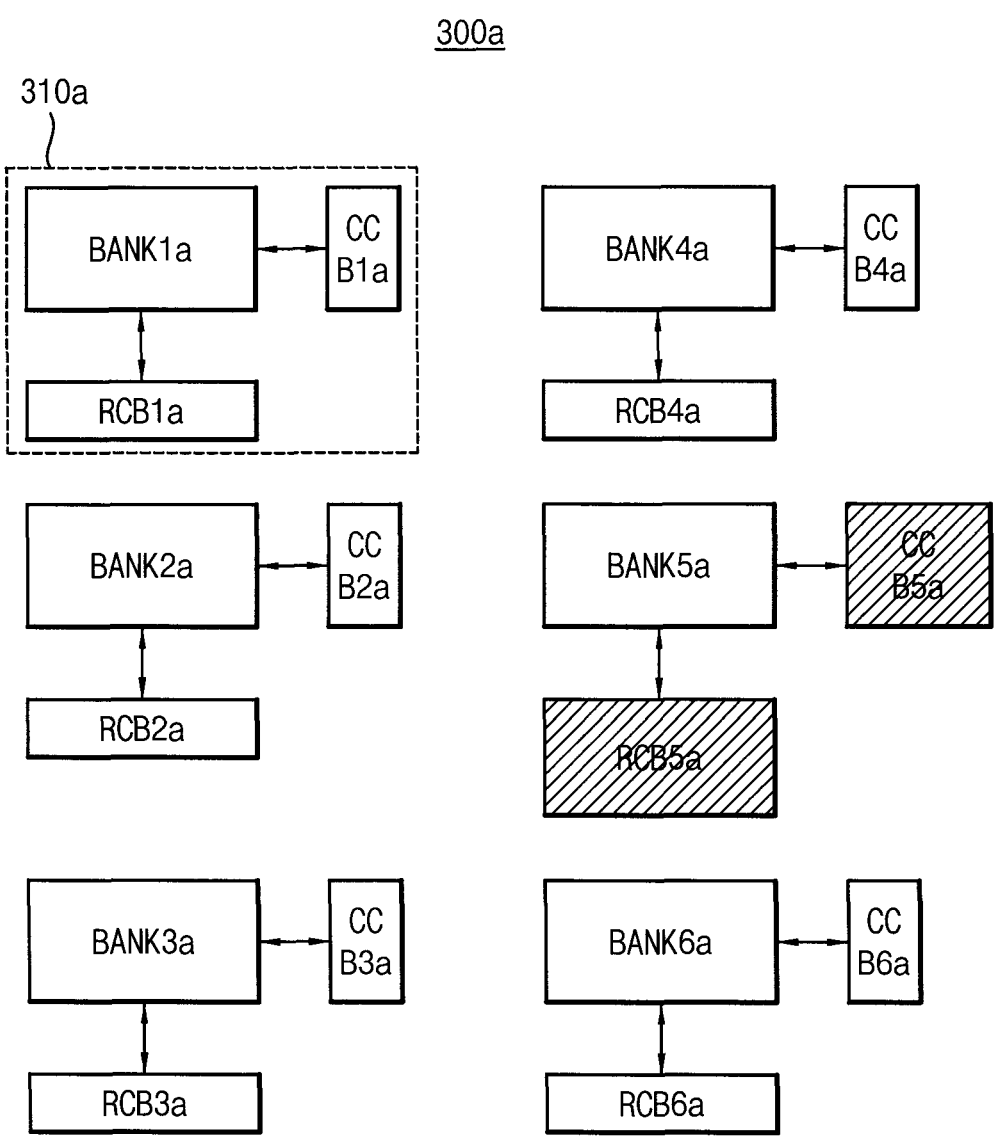
FIGS. 5 through 11 are block diagrams illustrating memory devices according to at least one example embodiment of the inventive concepts.

Referring to FIG. 5, a memory device 300a includes memory banks BANK1a through BANK6a, row redundant memory blocks RCB1a through RCB6a, and column redundant memory blocks CCB1a through CCB6a. The row redundant memory blocks RCB1a through RCB6a and the column redundant memory blocks CCB1a through CCB6a are allocated to the memory banks BANK1a through BANK6a respectively.

The first sub-memory device 310a included in the memory device 300a may be the memory device 200 of FIG. 4. The first memory bank BANK1a may be the normal memory cell array 210. The first row redundant memory block RCB1a and the first column redundant memory block CCB1a may be the redundant memory cell array 220. Fault memory units included in the first memory bank BANK1a may be replaced by using the first row redundant memory block RCBB1a and/or the first column redundant memory block CCB1a. The first sub-memory device 310a may further include the decoder 230, the non-volatile storage 240, the load controller LCON 250, and the repair control circuit 260 included in the memory device 200 of FIG. 4. The decoder 230, the non-volatile storage 240, the load controller LCON 250, and the repair control circuit 260 are omitted in FIG. 5.

Memory devices of FIGS. 6 through 11 may include a plurality of sub-memory devices. Each of the sub-memory devices may include one memory bank, a row redundant memory block allocated to the one memory bank, and a column redundant memory block allocated to the one memory bank. Each of the sub-memory devices has the same or similar structure with the first sub-memory device 310a.

The boot memory region 141 corresponds to the fifth memory bank BANK5a. The normal memory region 142 corresponds to the memory banks BANK1a through BANK4a and BANK6a. The redundant memory region 143 corresponds to the redundant memory blocks RCB1a through RCB6a and CCB1a through CCB6a.

The fifth redundant memory blocks RCB5a and CCB5a are allocated to the fifth memory bank BANK5a. Each of the redundant memory blocks RCB1a through RCB4a, RCB6a, CCB1a through CCB4a, and CCB6a is allocated to each of memory banks BANK1a through BANK4a, and BANK6a, respectively.

The boot memory region is repaired (S110) using only first repair memory units included in the fifth redundant memory block RCB5a, RCB5b as the boot repair memory units to repair a portion of the boot memory region corresponding to the fifth memory bank BANK5a. The normal memory region is repaired (S120) using only second repair memory units included in each of the redundant memory blocks RCB1a through RCB4a, RCB6a, CCB1a through CCB4a, and CCB6a as the normal repair memory units to repair a portion of the normal memory region corresponding to each of the memory banks BANK1a through BANK4a, BANK6a.

The size of the fifth redundant memory blocks RCB5a and CCB5a may be larger than the size of each of the redundant memory blocks RCB1a through RCB4a, RCB6a, CCB1a through CCB4a, and CCB6a. The size of the redundant memory blocks RCB1a through RCB4a, RCB6a, CCB1a through CCB4a, and CCB6a may represent the number of the repair memory units included in the redundant memory blocks RCB1a through RCB4a, RCB6a, CCB1a through CCB4a, and CCB6a.

Using a larger size for the fifth redundant memory blocks RCB5a, and CCB5a may increase the probability of errorless operation of the portion of the boot memory region corresponding to the fifth memory bank BANK5a because more repair units may be used, and thus, more fault memory units included in the fifth memory bank BANK5a can be repaired.

Figure 6:
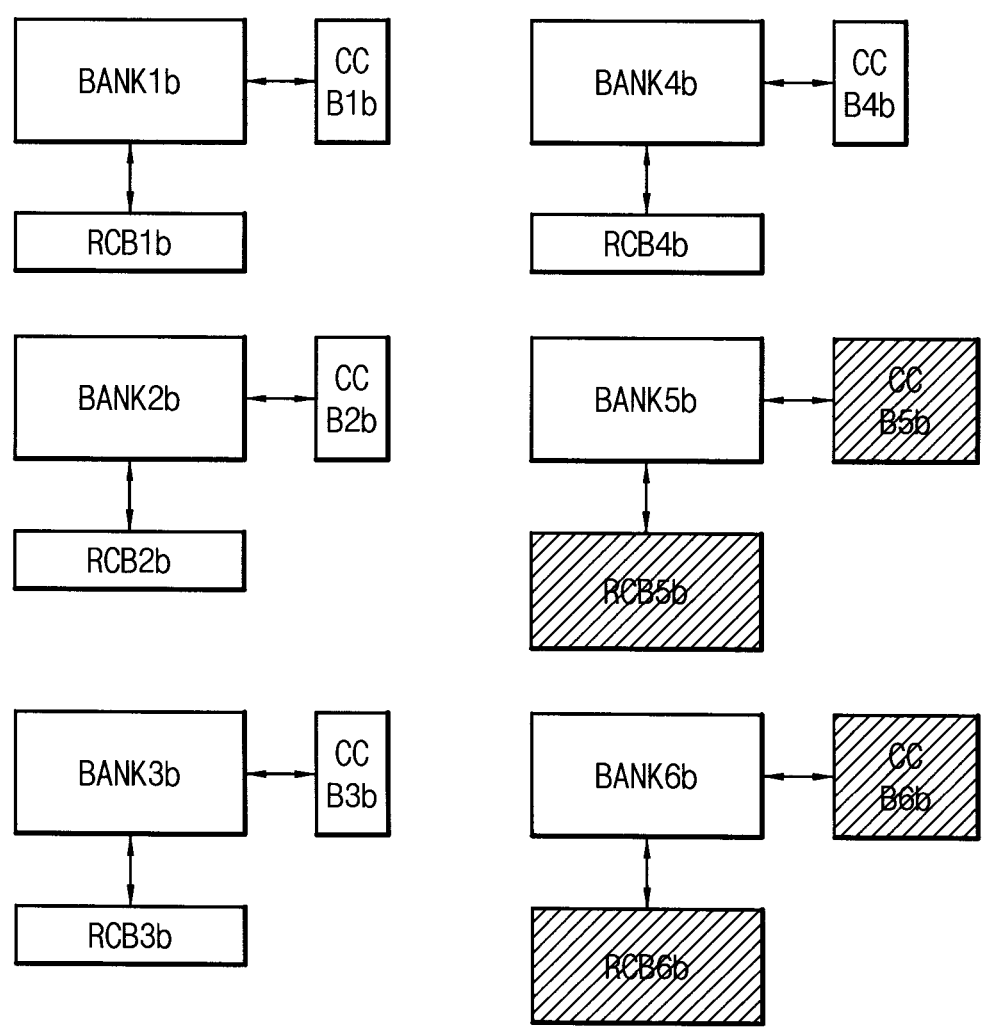

Referring to FIG. 6, the memory device 300b includes memory banks BANK1b through BANK6b, row redundant memory blocks RCB1b through RCB6b, and column redundant memory blocks CCB1b through CCB6b. The row redundant memory blocks RCB1b through RCB6b and the column redundant memory blocks CCB1b through CCB6b are allocated to the memory banks BANK1b through BANK6b, respectively.

The boot memory region 141 corresponds to the first memory banks BANK5b, and BANK6b. The normal memory region 142 corresponds to the second memory banks BANK1b through BANK4b. The redundant memory region 143 corresponds to the redundant memory blocks RCB1b through RCB6b, and CCB1b through CCB6b. The first redundant memory blocks RCB5b, RCB6b, CCB5b, and CCB6b are allocated to the first memory banks BANK5b, and BANK6b respectively. The second redundant memory blocks RCB1b through RCB4b, and CCB1b through CCB4b are allocated to the second memory banks BANK1b to BANK4b respectively.

The boot memory region is repaired (S110) using only first repair memory units included in each of the first redundant memory blocks RCB5b, RCB6b, CCB5b, and CCB6b as the boot repair memory units to repair a portion of the boot memory region corresponding to each of the first memory banks BANK5b, and BANK6b. The normal memory region is repaired (S120) using only second repair memory units included in each of the second redundant memory blocks RCB1a through RCB4a, and CCB1a through CCB4a as the normal repair memory units to repair a portion of the normal memory region corresponding to each of the second memory banks BANK1b through BANK4b.

The size of each of the first redundant memory blocks RCB5b, RCB6b, CCB5b, and CCB6b may be larger than the size of each of the second redundant memory blocks RCB1b through RCB4b, and CCB1b through CCB4b.

According to at least one example embodiment of the inventive concepts, though FIG. 6 illustrates an example where the boot memory region 141 corresponds only two first memory banks BANK5b and BANK6b, the boot memory region 141 may also correspond to more memory banks than the first memory banks BANK5b, and BANK6b. Further, the normal memory region 142 may corresponds to the memory banks BANK1b through BANK6b excluding the more memory banks.

Figure 7:
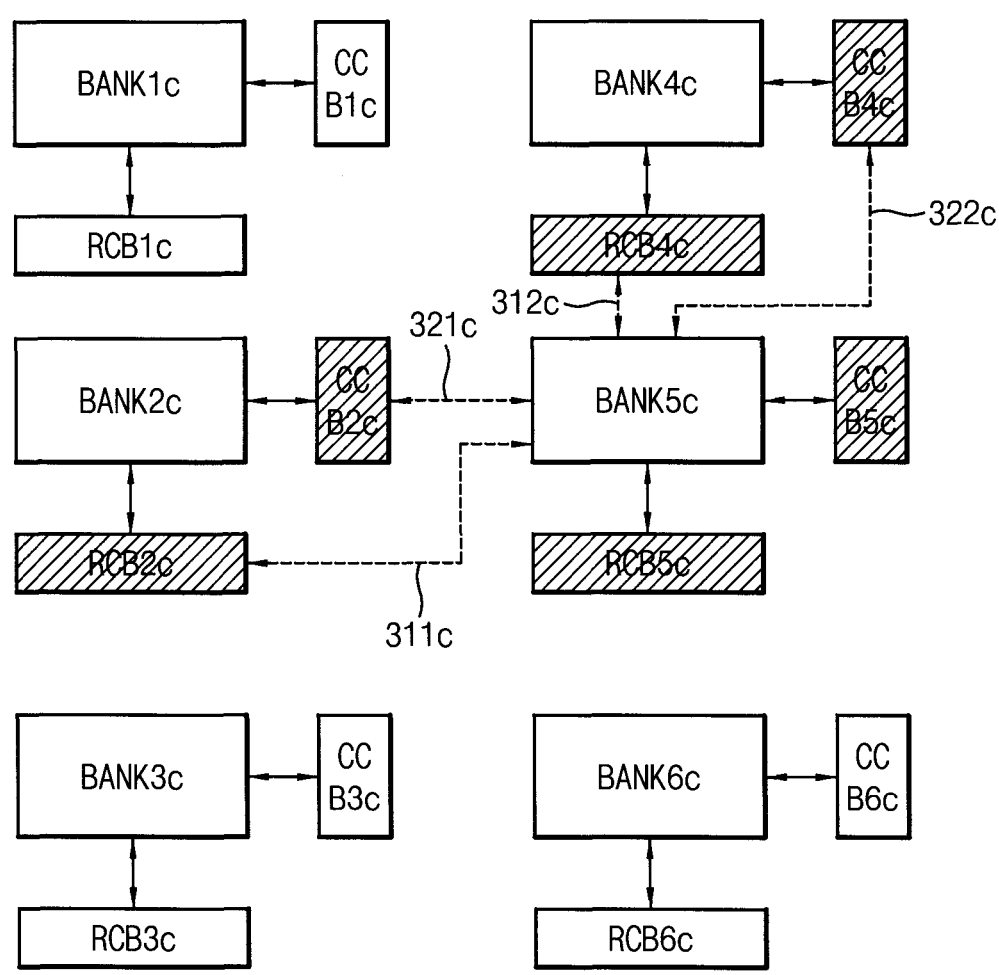

Referring to FIG. 7, a memory device 300c includes memory banks BANK1c through BANK6c, row redundant memory blocks RCB1c through RCB6c, and column memory blocks CCB1c through CCB6c. The row redundant memory blocks RCB1c through RCB6c and the column memory blocks CCB1c through CCB6c are allocated to the memory banks BANK1c through BANK6c, respectively.

The boot memory region 141 corresponds to the fifth memory bank BANK5c. The normal memory region 142 corresponds to the memory banks BANK1c through BANK4c, BANK6c. The redundant memory region 143 corresponds to the redundant memory blocks RCB1c through RCB6c, CCB1c through CCB6c.

The fifth redundant memory blocks RCB5c and CCB5c may be allocated to the fifth memory bank BANK5c. Each of the second redundant memory blocks RCB1c through RCB4c, RCB6c, CCB1c through CCB4c, and CCB6c may be allocated to each of the memory banks BANK1c through BANK4c, and BANK6c. The second redundant memory blocks RCB2c, and CCB2c which are allocated to the second memory bank BANK2c may be additionally allocated as shown by arrows 311c and 321c to the fifth memory bank BANK5c. The fourth redundant memory blocks RCB4c, and CCB4c which is allocated to the fourth memory bank BANK4c may be additionally allocated as shown by arrows 312c and 322c to the fifth memory bank BANK5c.

The boot memory region is repaired (S110) using only first repair memory units included in the second redundant memory blocks RCB2c and CCB2c, the fourth redundant memory blocks RCB4c and CCB4c, and the fifth redundant memory blocks RCB5c and CCB5c as the boot repair memory units to repair a portion of the boot memory region corresponding to the fifth memory bank BANK5c. The normal memory region is repaired (S120) using only second repair memory units included in each of the second redundant memory blocks RCB1c through RCB4c, RCB6c, CCB1c through CCB4c, and CCB6c as the normal repair memory units to repair a portion of the normal memory region corresponding to each of the memory banks BANK1c through BANK4c, and BANK6c.

More redundant memory blocks allocated to the fifth memory bank BANK5c may increase the probability of errorless operation of the portion of the boot memory region corresponding to the fifth memory bank BANK5c because more repair units may be used, and thus, more fault memory units included in the fifth memory bank BANK5c can be repaired.

Figure 8:
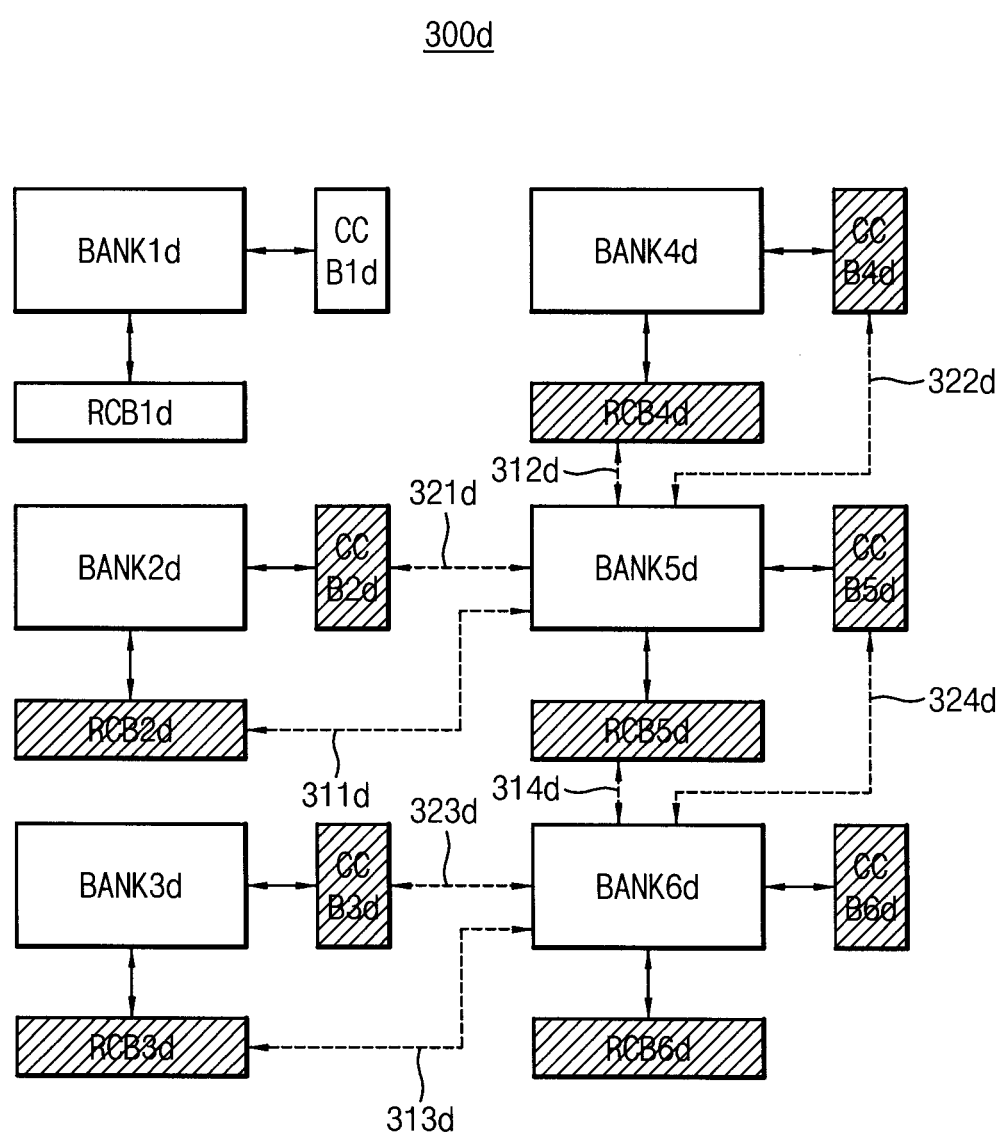

Referring to FIG. 8, a memory device 300d includes memory banks BANK1d through BANK6d, row redundant memory blocks RCB1d through RCB6d, and column memory blocks CCB1d through CCB6d. The row redundant memory blocks RCB1d through RCB6d and the column memory blocks CCB1d through CCB6d are allocated to the memory banks BANK1d through BANK6d, respectively.

The boot memory region 141 corresponds to first memory banks BANK5d, BANK6d. The normal memory region 142 corresponds to second memory banks BANK1d through BANK4d. The redundant memory region 143 corresponds to redundant memory blocks RCB1d through RCB6d, and CCB1d through CCB6d.

Each of the first redundant memory blocks RCB5d, RCB6d, CCB5d, and CCB6d is allocated to each of the first memory banks BANK5d, BANK6d. Each of the second redundant memory blocks RCB1d through RCB4d, and CCB1d through CCB4d is allocated to each of the second memory banks BANK1d through BANK4d. The second redundant memory blocks RCB2d, CCB2d allocated to the second memory bank BANK2d may be additionally allocated as shown by arrows 314d and 321d to the fifth memory bank BANK5d. The fourth redundant memory blocks RCB4d and CCB4d allocated to the fourth memory bank BANK4d may be additionally allocated as shown by arrows 312d and 322d to the fifth memory bank BANK5d. The third redundant memory blocks RCB3d and CCB3d allocated to the third memory bank BANK3d may be additionally allocated as shown by arrows 313d and 323d to the sixth memory bank BANK6d. The fifth redundant memory blocks RCB5d and CCB5d allocated to the fifth memory bank BANK5d may be additionally allocated as shown by arrows 314d and 324d to the sixth memory bank BANK6d.

The boot memory region is repaired (S110) using first repair memory units included in the second redundant memory blocks RCB2d and CCB2d, the fourth redundant memory blocks RCB4d and CCB4d, and the fifth redundant memory blocks RCB5d and CCB5d as the boot repair memory units to repair a portion of the boot memory region corresponding to the fifth memory bank BANK5d. The boot memory region is repaired (S110) using second repair memory units included in the third redundant memory blocks RCB3d and CCB3d, the fifth redundant memory blocks RCB5d and CCB5d, and the sixth redundant memory blocks RCB6d and CCB6d as the boot repair memory units to repair a portion of the boot memory region corresponding to the sixth memory bank BANK6d. The normal memory region is repaired (S120) using only third repair memory units included in each of the second redundant memory blocks RCB1d through RCB4d, CCB1d through CCB4d as the normal repair memory units to repair a portion of the normal memory region corresponding to each of the second memory banks BANK1d through BANK4d.

According to at least one example embodiment of the inventive concepts, though FIG. 6 illustrates an example where the boot memory region 141 corresponds only two first memory banks BANK5d and BANK6d, the boot memory region 141 may also correspond to more memory banks than the first memory banks BANK5d, and BANK6d. Further, the normal memory region 142 may correspond to the memory banks BANK1d through BANK6d excluding the more memory banks.

In still another example, more redundant memory blocks than the second redundant memory blocks RCB2d and CCB2d, the fourth redundant memory blocks RCB4d and CCB4d, and the fifth redundant memory blocks RCB5d and CCB5d may be allocated to the fifth memory bank BANK5d. More redundant memory blocks than the third redundant memory blocks RCB3d and CCB3d, the fifth redundant memory blocks RCB5d and CCB5d, and the sixth redundant memory blocks RCB6d and CCB6d may be allocated to the sixth memory bank BANK6d.

Figure 9:
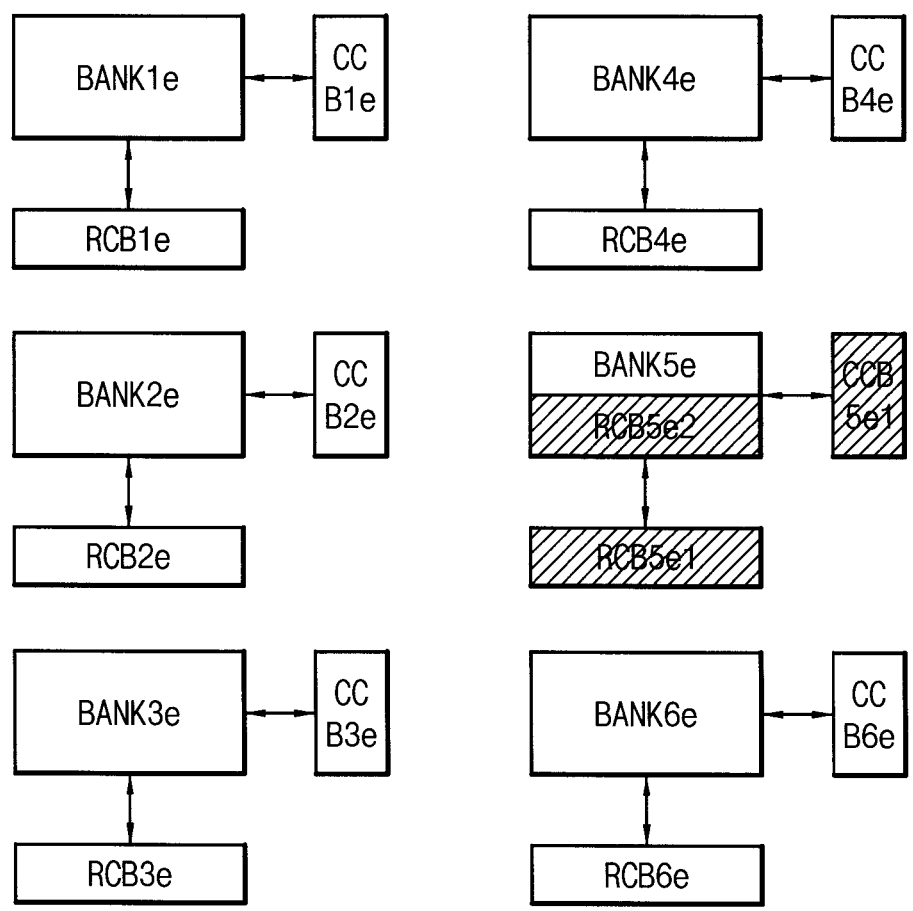

Referring to FIG. 9, a memory device 300e has the same or similar structure with the memory device 300a of FIG. 5 but a size of a fifth redundant memory blocks RCB5e1, and CCB5e1, and existence of an additional fifth row redundant memory block RCB5e2.

The fifth memory bank BANK5e includes a normal memory block and the additional fifth row redundant memory block RCB5e2. The boot memory region is repaired (S110) by excluding fault memory units included in the normal memory block. The boot memory region is repaired (S110) using repair memory units included in the additional fifth row redundant memory block RCB5e2 instead of the fault memory units.

Figure 10:
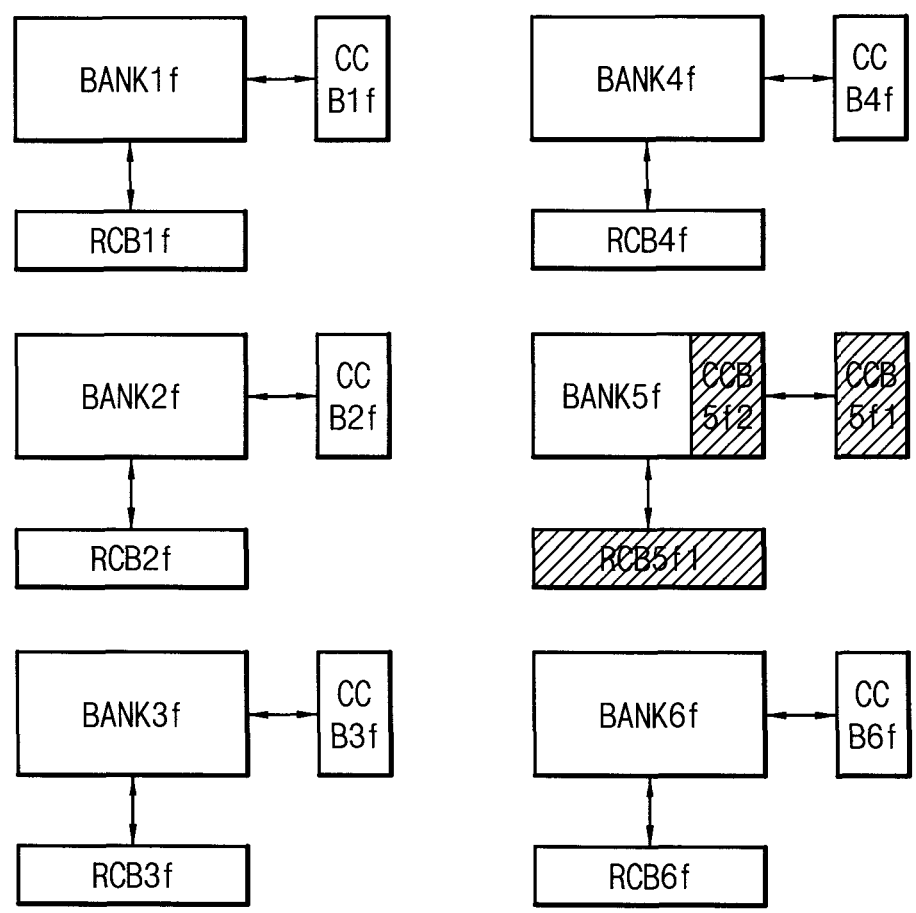

Referring to FIG. 10, a memory device 300f has the same or similar structure with the memory device 300a of FIG. 5 but a size of fifth redundant memory blocks RCB5f1 and CCB5f1, and existence of an additional fifth column redundant memory block CCB5f2.

The fifth memory bank BANK5f includes a normal memory block and the additional fifth column redundant memory block CCB5f2. The boot memory region is repaired (S110) by excluding fault memory units included in the normal memory block. The boot memory region is repaired (S110) using repair memory units included in the additional fifth column redundant memory block CCB5f2 instead of the fault memory units. A process of excluding and repairing fault memory units included in the memory device of FIG. 9 and FIG. 10 will be described with reference to FIG. 12.

Figure 11:
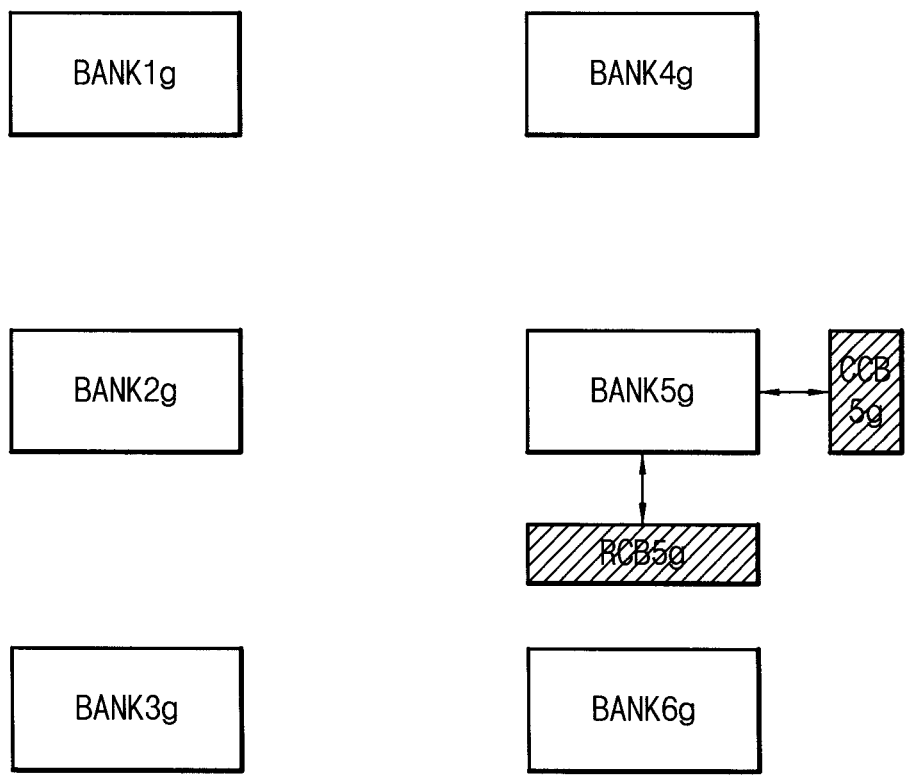

Referring to FIG. 11, a memory device 300g includes memory banks BANK1g through BANK6g, row redundant memory block RCB5g, and column redundant memory block CCB5g. The row redundant memory block RCB5g and the column redundant memory block CCB5g are allocated to the memory banks BANK1g through BANK6g.

The boot memory region 141 corresponds to the fifth memory bank BANK5g. The normal memory region 142 corresponds to the memory banks BANK1g through BANK6g. The redundant memory region 143 corresponds to the redundant memory block RCB5g, CCB5g. Only the fifth redundant memory block RCB5g, CCB5g is allocated to the fifth memory bank BANK5g.

The boot memory region is repaired (S110) using only first repair memory units included in the fifth redundant memory blocks RCB5g and CCB5g as the boot repair memory units to repair a portion of the boot memory region corresponding to the fifth memory bank BANK5g. The normal memory region is not repaired (S120) by replacing fault memory units of the memory banks BANK1g, BANK2g, BANK3g, BANK4g, and BANK6g with repair memory units The normal memory region is repaired (S120) by excluding the fault memory units of the memory banks BANK1g, BANK2g, BANK3g, BANK4g, and BANK6g.

Figure 12:
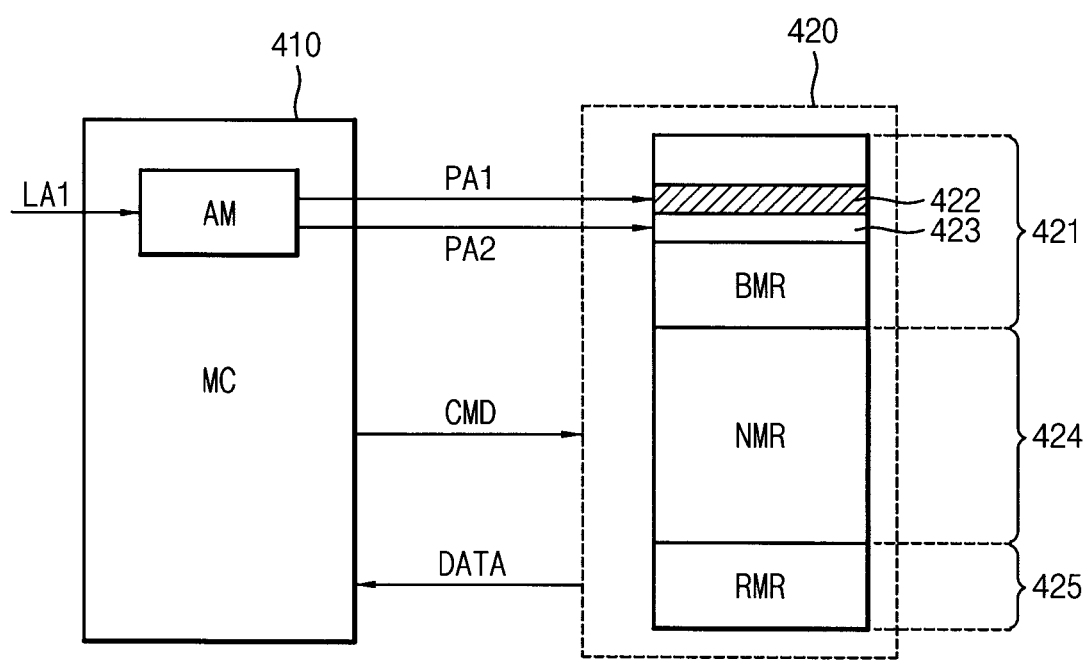
FIG. 12 is a block diagram illustrating a memory system excluding fault memory cells included in the memory device according to at least one example embodiment of the inventive concepts.

FIG. 12 is a block diagram illustrating a memory system excluding fault memory cells included in the memory device according to at least one example embodiment of the inventive concepts.

Referring to FIG. 12, a memory system 400 includes a memory controller MC 410 and a memory device 420. A memory controller 410 includes an address map AM. The memory device 420 includes a boot memory region BMR 421, a normal memory region NMR 424, and a redundant memory region RMR 425. The boot memory region 421 includes a fault memory unit 422 having fault memory cells and a normal memory unit 423. The memory device 420 may be embodied with the memory device 100 of FIG. 2.

The address map AM translates a first logical address LA1 used by a processor to a first physical address PA1 or a second physical address PA2 used by the memory device 420. The memory controller 410 transfers a command signal CMD to the memory device 420. The memory controller 410 transfers a physical address corresponding to the first logical address LA1 to the memory device 420 as the first physical address PA1 or the second physical address PA2. The memory device 420 transfers a data signal DATA corresponding to the command signal CMD and the physical address corresponding to the first logical address LA1 to the memory controller 410.

When a memory unit pointed by the first physical address PA1 corresponding to the first logical address LA1 is the fault memory unit 422, the memory controller 410 may exclude the fault memory unit 422 by changing the address map AM such that the first logical address LA1 corresponds to the second physical address PA2 pointing the normal memory unit 423. The procedure to exclude the fault memory unit 422 of boot memory region 421 may be applied to the normal memory region 424.

Figure 13:
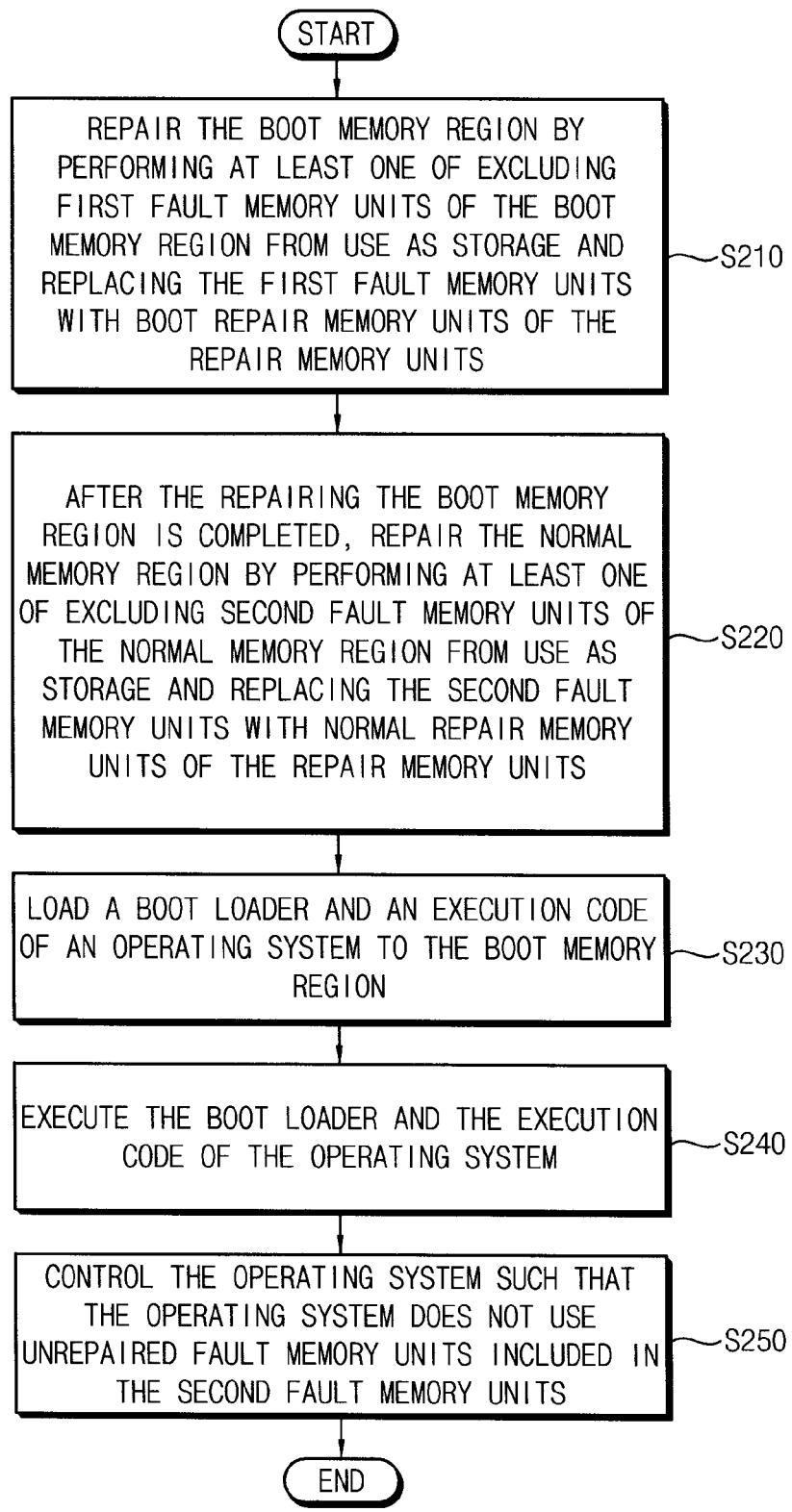
FIG. 13 is a flow chart illustrating a method of booting a system including a memory device according to at least one example embodiment of the inventive concepts.

FIG. 13 is a flow chart illustrating a method of booting a system including a memory device according to at least one example embodiment of the inventive concepts.

Referring to FIGS. 2 and 13, the memory device 100 includes a boot memory region 141, a normal memory region 142, and a redundant memory region 143. The redundant memory region 143 includes a plurality of repair memory units 121, 122, 123, and 124.

To boot a system including the memory device 100, the boot memory region 141 is repaired by excluding first fault memory units 151, 152, and 153 in the boot memory region 141 from use as storage or replacing, as is shown by arrows 131, 132, and 133 in FIG. 2, the first fault memory units 111, 112, and 113 with boot repair memory units 121, 122, and 123 of the repair memory units 121, 122, 123, and 124 (S210). Each of the first fault memory units has at least one fault memory cell. After repairing the boot memory region 141 is completed, the normal memory region 142 is repaired by excluding second fault memory units 114 and 115, and 116 of the normal memory region 142 from use as storage or replacing the second fault memory units 114, 115, and 116 with normal repair memory units 124 of the repair memory units 121, 122, 123, and 124 (S220). Each of the second fault memory units has at least one fault memory cell. A boot loader and an execution code of an operating system are loaded to the boot memory region 141 (S230). The boot loader and the execution code of the operating system are executed (S240).

The repairing the boot memory region (S210), the repairing the normal memory region (S220), the loading the boot loader and the execution code of the operating system (S230), and the executing the boot loader and the execution code of the operating system (S240) may be understood based on the references to FIGS. 1 through 12.

According to at least one example embodiment, the system including the memory device 100 may perform a boot operation without using the fault memory units excluded in step S210, the excluded memory units being unrepaired fault memory units from among the first fault memory units 111, 112, and 113 that were not replaced. According to at least one example embodiment, an operating system of the system including the memory device 100 may be controlled not to use the faulty memory units excluded in step S220, the excluded memory units being unrepaired fault memory units inform among the second fault memory units 114, 115, and 116 that were not replaced.

According to at least one example embodiment of the inventive concepts, the operating system may be controlled not to use the unrepaired fault memory units by the method to change the address map AM such that the first logical address LA1 does not correspond to the first physical address PA1 pointing to the fault memory unit 422, and the first logical address LA1 corresponds to the second physical address PA2 pointing to the normal memory unit 423. The method was described with the reference to FIG. 12.

According to at least one example embodiment of the inventive concepts, the operating system may be controlled not to use the first logical address LA1 when the memory controller 410 cannot change the address map AM such that the first logical address LA1 corresponds to the second physical address PA2 pointing to the normal memory unit 423.

Figure 14:
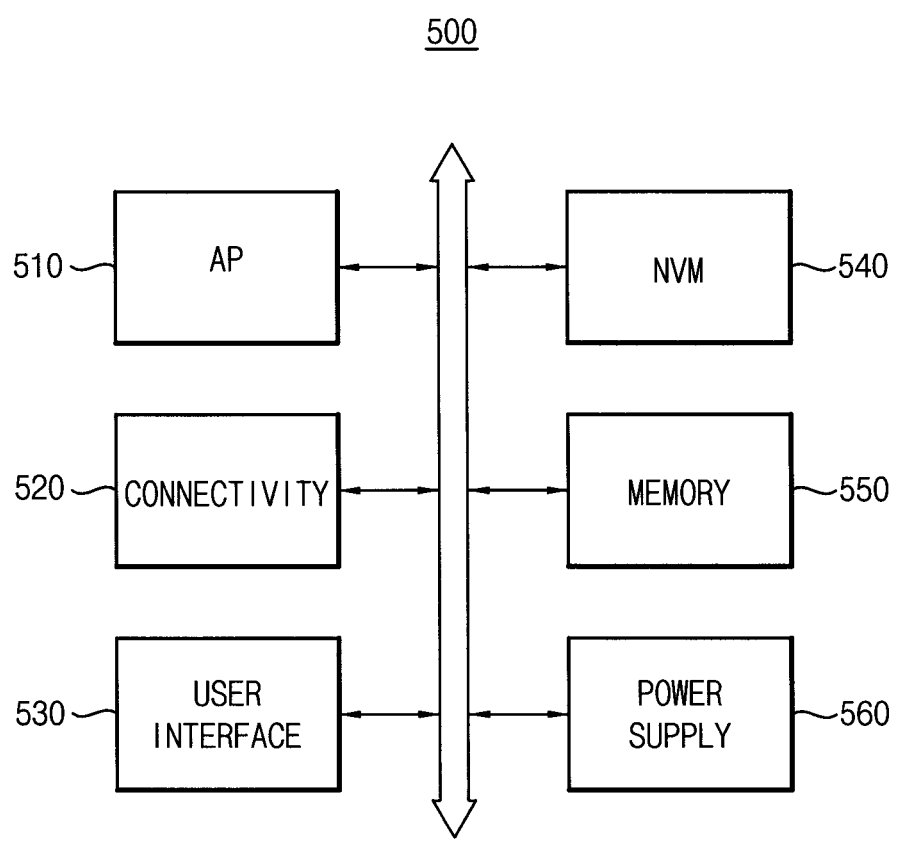
FIG. 14 is a block diagram illustrating a mobile system including a memory device according to at least one example embodiment of the inventive concepts.

FIG. 14 is a block diagram illustrating a mobile system including a memory device according to at least one example embodiment of the inventive concepts.

Referring to FIG. 14, a mobile system 500 includes an application processor (AP) 510, a connectivity unit 520, a memory device 550, a nonvolatile memory (NVM) device 540, a user interface 530 and a power supply 560. In an exemplary embodiment the mobile system 500 may be a mobile phone, a smart phone, a personal digital assistant (PDA), a portable multimedia player (PMP), a digital camera, a music player, a portable game console, a navigation system, etc.

The application processor 510 may execute applications, such as a web browser, a game application, a video player, etc. In an exemplary embodiment the application processor 510 may include a single core or multiple cores. For example, the application processor 510 may be a multi-core processor, such as a dual-core processor, a quad-core processor, a hexa-core processor, and the like. The application processor 510 may include an internal or external cache memory.

The connectivity unit 520 may perform wired or wireless communication with an external device. For example, the connectivity unit 520 may perform Ethernet communication, near field communication (NFC), radio frequency identification (RFID) communication, mobile telecommunication, memory card communication, universal serial bus (USB) communication, etc. In an exemplary embodiment connectivity unit 520 may include a baseband chipset that supports communications, such as global system for mobile communications (GSM), general packet radio service (GPRS), wideband code division multiple access (WCDMA), high speed downlink/uplink packet access (HSxPA), etc.

The memory device 550 may store data processed by the application processor 510, or may operate as a working memory. Each of memory cells included in the memory device 550 may include a write transistor, a read transistor and a metal oxide semiconductor (MOS) capacitor. The write transistor may include a gate electrode coupled to a write word line, a first electrode coupled to a write bit line and a second electrode coupled to a storage node. The read transistor may include a gate electrode coupled to the storage node, a first electrode coupled to a read word line and a second electrode coupled to a read bit line. The MOS capacitor may include a gate electrode coupled to the storage node and a lower electrode coupled to a synchronization control line. A synchronization pulse signal may be applied to the lower electrode of the MOS capacitor in synchronization with a write word line signal in a write operation and applied to the lower electrode of the MOS capacitor in synchronization with a read word line signal in a read operation such that a coupling effect may occur at the storage node through the MOS capacitor in response to the synchronization pulse signal. Therefore, a data retention time of the memory cell included in the memory device 550 may increase. As such, the memory device 550 may have a longer data retention time than a dynamic random access memory (DRAM) and a higher density than a static random access memory (SRAM). The memory device 550 may be embodied with a memory device which is repaired during a test time by the method described with the reference to FIG. 1. The memory device 550 may be or include one or more of the memory devices 100, 100a, and 300a through 300g of FIGS. 2, 3 and 5 through 11. The method of repairing the memory device 550 and a structure and an operation of the memory device 550 were described with the references to FIGS. 1 through 12.

The nonvolatile memory device 540 may store a boot image for booting the mobile system 500. For example, the nonvolatile memory device 540 may be or include one or more of an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), etc.

The user interface 530 may include at least one input device, such as a keypad, a touch screen, etc., and at least one output device, such as a speaker, a display device, etc. The power supply 560 may supply a power supply voltage to the mobile system 500.

In some embodiments, the mobile system 500 may further include an image processor, and/or a storage device, such as a memory card, a solid state drive (SSD), a hard disk drive (HDD), a CD-ROM, etc.

In some embodiments, the mobile system 500 and/or components of the mobile system 500 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 15:
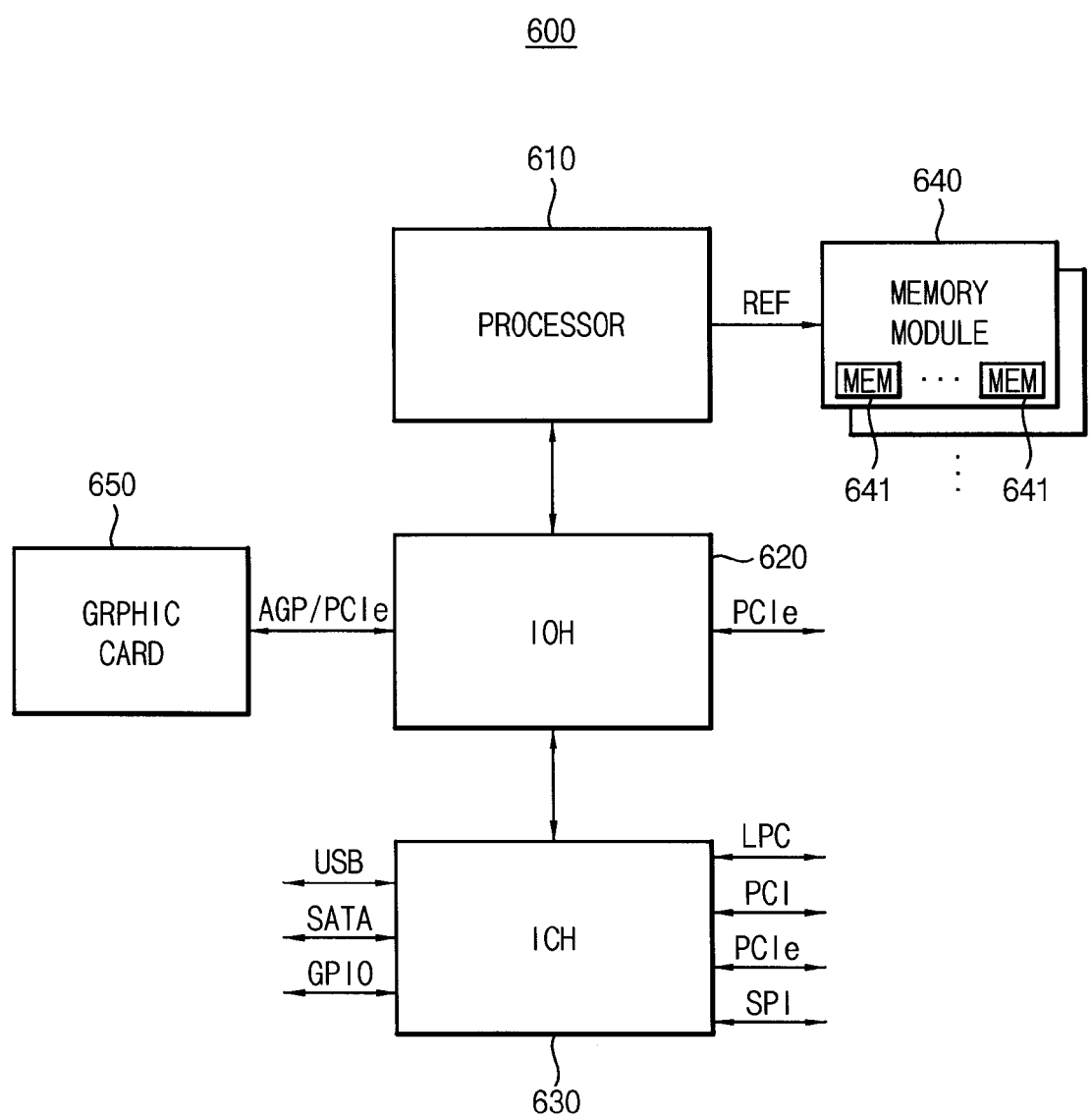
FIG. 15 is a block diagram illustrating a computing system including a memory device according to at least one example embodiment of the inventive concepts.

FIG. 15 is a block diagram illustrating a computing system including a memory device according to at least one example embodiment of the inventive concepts.

Referring to FIG. 15, a computing system 600 includes a processor 610, an input/output hub (IOH) 620, an input/ output controller hub (ICH) 630, at least one memory module 640 and a graphics card 650. In some embodiments, the computing system 600 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, etc.

The processor 610 may perform various computing functions, such as executing specific software for performing specific calculations or tasks. For example, the processor 610 may be a microprocessor, a central process unit (CPU), a digital signal processor, or the like. In some embodiments, the processor 610 may include a single core or multiple cores. For example, the processor 610 may be a multi-core processor, such as a dual-core processor, a quad-core processor, a hexa-core processor, etc. Although FIG. 15 illustrates the computing system 600 including one processor 610, in some embodiments, the computing system 600 may include a plurality of processors.

The processor 610 may include a memory controller for controlling operations of the memory module 640. The memory controller included in the processor 610 may be referred to as an integrated memory controller (IMC). A memory interface between the memory controller and the memory module 640 may be implemented with a single channel including a plurality of signal lines, or may bay be implemented with multiple channels, to each of which at least one memory module 640 may be coupled. In some embodiments, the memory controller may be located inside the input/output hub 620. The input/output hub 620 including the memory controller may be referred to as memory controller hub (MCH).

The memory module 640 may include a plurality of memory devices MEM 641 that store data provided from the memory controller. Each of memory cells included in the memory device 641 may include a write transistor, a read transistor and a metal oxide semiconductor (MOS) capacitor. The write transistor may include a gate electrode coupled to a write word line, a first electrode coupled to a write bit line and a second electrode coupled to a storage node. The read transistor may include a gate electrode coupled to the storage node, a first electrode coupled to a read word line and a second electrode coupled to a read bit line. The MOS capacitor may include a gate electrode coupled to the storage node and a lower electrode coupled to a synchronization control line. A synchronization pulse signal may be applied to the lower electrode of the MOS capacitor in synchronization with a write word line signal in a write operation and applied to the lower electrode of the MOS capacitor in synchronization with a read word line signal in a read operation such that a coupling effect may occur at the storage node through the MOS capacitor in response to the synchronization pulse signal. Therefore, a data retention time of the memory cell included in the memory device 641 may increase. As such, the memory device 641 may have a longer data retention time than a dynamic random access memory (DRAM) and a higher density than a static random access memory (SRAM). The memory device 641 may be embodied with a memory device which is repaired during a test time by the method described with the reference to FIG. 1. The memory device 641 may be embodied with one or more of the memory devices 100, 100a, and 300a through 300g of FIGS. 2, 3 and 5 through 11. The method of repairing the memory device 641 and a structure and an operation of the memory device 641 were described with the references to FIGS. 1 through 12.

The input/output hub 620 may manage data transfer between processor 610 and devices, such as the graphics card 650. The input/output hub 620 may be coupled to the processor 610 via various interfaces. For example, the interface between the processor 610 and the input/output hub 620 may be a front side bus (FSB), a system bus, a HyperTransport, a lightning data transport (LDT), a QuickPath interconnect (QPI), a common system interface (CSI), etc. The input/output hub 620 may provide various interfaces with the devices. For example, the input/output hub 620 may provide an accelerated graphics port (AGP) interface, a peripheral component interface-express (PCIe), a communications streaming architecture (CSA) interface, etc. Although FIG. 15 illustrates the computing system 600 including one input/output hub 620, in some embodiments, the computing system 600 may include a plurality of input/output hubs.

The graphics card 650 may be coupled to the input/output hub 620 via AGP or PCIe. The graphics card 650 may control a display device for displaying an image. The graphics card 650 may include an internal processor for processing image data and an internal memory device. In some embodiments, the input/output hub 620 may include an internal graphics device along with or instead of the graphics card 650 outside the graphics card 650. The graphics device included in the input/output hub 620 may be referred to as integrated graphics. Further, the input/output hub 620 including the internal memory controller and the internal graphics device may be referred to as a graphics and memory controller hub (GMCH).

The input/output controller hub 630 may perform data buffering and interface arbitration to efficiently operate various system interfaces. The input/output controller hub 630 may be coupled to the input/output hub 620 via an internal bus, such as a direct media interface (DMI), a hub interface, an enterprise Southbridge interface (ESI), PCIe, etc.

The input/output controller hub 630 may provide various interfaces with peripheral devices. For example, the input/output controller hub 630 may provide a universal serial bus (USB) port, a serial advanced technology attachment (SATA) port, a general purpose input/output (GPIO), a low pin count (LPC) bus, a serial peripheral interface (SPI), PCI, PCIe, etc.

In some embodiments, the processor 610, the input/output hub 620 and the input/output controller hub 630 may be implemented as separate chipsets or separate integrated circuits. In other embodiments, at least two of the processor 610, the input/output hub 620 and the input/output controller hub 630 may be implemented as a single chipset.

As described above, the method of repairing the memory device according to at least one example embodiment of the inventive concepts may repair the boot memory region prior to the normal memory region by excluding the fault memory units included in the boot memory region where the boot loader and the operating system are loaded or replacing the fault memory units with the repair memory units.

The method of booting the system having the memory device according to at least one example embodiment of the inventive concepts may guarantee an errorless booting of the system having the memory device by repairing the boot memory region prior to the normal memory region by excluding the fault memory units included in the boot memory region where the boot loader and the operating system are loaded or replacing the fault memory units with the repair memory units.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of at least one example embodiment of the inventive concepts. Accordingly, all such modifications are intended to be included within the scope of at least one example embodiment of the inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of repairing a memory device including a boot memory region, a normal memory region, and a redundant memory region, the redundant memory region including a plurality of repair memory units, the method comprising:
   repairing the boot memory region by performing at least one of excluding first fault memory units of the boot memory region from use as storage and replacing the first fault memory units with boot repair memory units of the repair memory units, each of the first fault memory units having at least one fault memory cell; and
   after the repairing the boot memory region is completed, repairing the normal memory region by performing at least one of excluding second fault memory units of the normal memory region from use as storage and replacing the second fault memory units with normal repair memory units of the repair memory units, each of the second fault memory units having at least one fault memory cell.

2. The method of claim 1, wherein at least one of the first memory units and the second memory units correspond, respectively, to word lines of the memory device such that at least one of the repairing the boot memory region and the repairing the normal memory region includes repairing memory units of a word line of the memory device.

3. The method of claim 1, wherein at least one of the first memory units and the second memory units correspond, respectively, to bit lines of the memory device such that at least one of the repairing the boot memory region and the repairing the normal memory region includes repairing memory units of a bit line of the memory device.

4. The method of claim 1, wherein the memory device includes at least one first memory bank corresponding to the boot memory region, at least one second memory bank corresponding to the normal memory region, and at least one first redundant memory block and at least one second redundant memory block corresponding to the redundant memory region, the first redundant memory block is allocated to the first memory bank, and the second redundant memory block is allocated to the second memory bank, such that the repairing the boot memory region includes repairing units of the at least one first memory bank, and the repairing the normal memory region includes repairing units of the at least one second memory bank.

5. The method of claim 4, wherein
   the repairing the boot memory region includes using only first repair memory units included in the first redundant memory block as the boot repair memory units, and
   the repairing the normal memory region includes using only second repair memory units included in the second redundant memory block as the normal repair memory units.

6. The method of claim 5, wherein a size of the first redundant memory block is larger than a size of the second redundant memory block.

7. The method of claim 4, wherein the repairing the boot memory region includes using first repair memory units included in the first redundant memory block and second repair memory units included in the second redundant memory block as the boot repair memory units, and the repairing the normal memory region includes using third repair memory units included in the second redundant memory block as the normal repair memory units.

8. The method of claim 1, wherein the memory device includes at least one first memory bank corresponding to the boot memory region, at least one second memory bank corresponding to the normal memory region, and a redundant memory block corresponding to the redundant memory region, and the redundant memory block is allocated only to the first memory bank, such that the repairing the boot memory region includes repairing units of the at least one first memory bank, and the repairing the normal memory region includes repairing units of the at least one second memory bank.

9. The method of claim 8, wherein the repairing the boot memory region includes replacing the first fault memory units with the boot repair memory units included in the redundant memory block, and the repairing the normal memory region includes excluding the second fault memory units from use as storage.

10. The method of claim 1, wherein the repairing the boot memory region includes changing an address map for the memory device to exclude the first fault memory units, and a memory controller includes the address map.

11. The method of claim 1, wherein the repairing the normal memory region includes changing an address map for the memory device to exclude the second fault memory units, and a memory controller includes the address map.

12. The method of claim 1, further comprising:
    loading a boot loader and an execution code of an operating system to the boot memory region.

13. The method of claim 1, wherein a sum of the number of the first fault memory units and the number of the second fault memory units is larger than the number of the repair memory units of the redundant memory region.

14. A method of booting a system including a memory device including a boot memory region, a normal memory region, and a redundant memory region, the redundant memory region including a plurality of repair memory units, the method comprising:
    repairing the boot memory region by performing at least one of excluding first fault memory units of the boot memory region from use as storage and replacing the first fault memory units with boot repair memory units of the repair memory units, each of the first fault memory units having at least one fault memory cell;
    after the repairing the boot memory region is completed, repairing the normal memory region by performing at least one of excluding second fault memory units of the normal memory region from use as storage and replacing the second fault memory units with normal repair memory units of the repair memory units, each of the second fault memory units having at least one fault memory cell;

loading a boot loader and an execution code of an operating system to the boot memory region; and executing the boot loader and the execution code of the operating system.

15. The method of claim 14, further comprising:

controlling the operating system such that the operating system does not use unrepaired fault memory units included in the second fault memory units.

16. A method of operating a memory system including a first plurality of redundant memory blocks, a first memory sub-device, and a second memory sub-device, the first memory sub-device including a boot memory region and first redundant memory blocks allocated to the boot memory region, the second memory sub-device including a normal memory region and second redundant memory blocks allocated to the normal memory region, the first redundant memory blocks and the second redundant memory blocks being blocks of the first plurality of redundant memory blocks of the memory system, the method comprising:

identifying a first fault memory cell in a first memory unit of the boot memory region;

identifying a second fault memory cell in a second memory unit of the normal memory region;

repairing the boot memory region by replacing the first memory unit with a first redundant unit from one of a plurality of boot repair memory blocks, the plurality of boot repair memory blocks being redundant memory blocks from among the first plurality of redundant memory blocks of the memory system allocated to the boot memory region, the plurality of boot repair memory blocks including the first redundant memory blocks;

repairing the normal memory region by replacing the second memory unit with a second redundant unit from the second redundant memory blocks, the second redundant memory blocks including all blocks from among the first plurality of redundant memory blocks of the memory system allocated to the normal memory region, a total number of redundant units included in the second redundant memory blocks being less than a total number of redundant units included in the plurality of boot repair memory blocks; and storing code for at least one of a boot loader, a basic input/output system (BIOS) and an operating system in the repaired boot memory region.

17. The method of claim 16 further comprising:

storing application code other than the code for the boot loader, the basic input/output system (BIOS) and the operating system in the repaired normal memory region.

18. The method of claim 17, wherein, when the normal memory region includes a third fault memory cell in a third memory unit, the method further comprises:

repairing the normal memory region by excluding the third memory unit from use as storage without replacing the third memory unit with a redundant memory unit.

19. The method of claim 16 wherein the normal memory region is a first memory bank of the memory system, and the boot memory region is a second memory bank of the memory system.

* * * * *